United States Patent [19]

Anderson et al.

[11] Patent Number: 5,051,366
[45] Date of Patent: Sep. 24, 1991

[54] ELECTRICAL CONNECTOR

[75] Inventors: Dale H. Anderson; Don K. Walston; George G. Zamora, all of Tucson, Ariz.

[73] Assignee: International Business Machines Corporation, Armonk, N.Y.

[21] Appl. No.: 591,159

[22] Filed: Oct. 1, 1990

[51] Int. Cl.⁵ .............................................. H01R 9/09
[52] U.S. Cl. ...................................... 436/67; 439/73; 439/77; 439/329; 439/492
[58] Field of Search ..................... 439/67, 73, 77, 329, 439/462, 492, 493, 499

[56] References Cited

U.S. PATENT DOCUMENTS

| | | | |
|---|---|---|---|
| 2,981,918 | 4/1961 | Gluck et al. | 339/103 |
| 3,977,756 | 8/1976 | Rodondi | 339/176 |
| 4,116,516 | 9/1978 | Griffin | 339/17 |
| 4,468,074 | 8/1984 | Gordon | 339/75 |
| 4,538,865 | 9/1985 | Wakabayashi et al. | 339/17 |
| 4,647,125 | 3/1987 | Landi et al. | 339/17 |
| 4,655,524 | 4/1987 | Etzel | 339/59 |
| 4,691,972 | 9/1987 | Gordon | 439/77 |
| 4,695,258 | 9/1987 | Hanson et al. | 439/67 |
| 4,717,345 | 1/1988 | Gordon et al. | 439/67 |
| 4,744,764 | 5/1988 | Rubenstein | 439/62 |
| 4,768,971 | 9/1988 | Simpson | 439/329 |
| 4,770,645 | 9/1986 | Antes | 339/176 |
| 4,808,112 | 2/1989 | Wood et al. | 439/66 |
| 4,832,609 | 5/1989 | Chung | 439/67 |
| 4,871,315 | 10/1989 | Noschese | 439/67 |
| 4,907,975 | 3/1990 | Dranchak et al. | 439/77 |
| 4,913,656 | 4/1990 | Gordon et al. | 439/67 |

OTHER PUBLICATIONS

R. C. Miller, "Connector for Multilayer Circuit Package", Oct., 1972, IBM Tech. Discl. Bulletin, vol. 15, No. 5, pp. 1614–1615.
R. S. Blackwell et al., "Flexible Tape Cable Connection," Apr., 1976, IBM Tech. Discl. Bulletin, vol. 18, No. 11, p. 3830.

Primary Examiner—Paula A. Bradley
Attorney, Agent, or Firm—Manny W. Schecter

[57] ABSTRACT

An electrical connector including a top clamp plate, two circuit bars, a resilient pressure pad, a bottom clamp plate, and means for fastening two flexible circuits and a third circuit device in mating electrical contact therein is disclosed. Each flexible circuit is mounted on and wrapped about a separate one of the circuit bars with an adhesive to provide a solidly backed sub-assembly. The top clamp plate is then fastened to the sub-assemblies with screws and retaining clips to create a single sub-assembly. The resilient pressure pad is mounted on the bottom clamp plate and the third circuit device is mounted thereon. Each circuit bar is then mounted over the third circuit device to make electrical contact between the third circuit device and each flexible circuit. The components are aligned using pins extending upward from the bottom clamp plate. The single sub-assembly is then fastened to the bottom clamp plate using screws to complete the assembly. In an alternative embodiment, a resilient connector pressure pad having wires extending through and protruding from the thickness thereof is used. The resilient connector pressure pad is located between the flexible circuits and the third circuit device, the wires protruding therefrom actually completing the electrical contact.

30 Claims, 6 Drawing Sheets

ELECTRICAL CONNECTOR

BACKGROUND OF THE INVENTION

1. FIELD OF THE INVENTION

This invention relates to an electrical connector. More particularly, the invention is an electrical connector for establishing electrical contact between two or more flexible circuits and at least one other circuit device.

2. DESCRIPTION OF THE RELATED ART

Conventional methods of interconnecting electrical or electronic circuit components consist of the use of separate connector structures and/or soldering terminals on the components to conductors which deliver current to or from the components. While generally suitable for its intended purposes, interconnecting electrical components via separate connector structures does suffer from certain drawbacks and deficiencies including high manufacturing and purchasing costs during installation and connection. Similarly, soldering terminals is undesirable as the substrate which supports an exposed terminal must be able to withstand relatively high temperatures with no adverse effects. Also, soldering connections can be time consuming and therefore be labor intensive and expensive. Another problem with soldered connections is the relative difficulty in disconnecting a soldered terminal during repairs and manufacturing. Finally, such electrical connectors simply cannot provide adequate isolation between circuit traces in applications specifying very tightly spaced circuit traces, such as those required to connect multitrack magnetic tape heads to the remaining components of a tape drive. An example of such is the 18 track magnetic tape head in the IBM 3490 Tape Drive. As track densities increase in the future, the need for alternative connectors also increases.

In some applications it has been found desirable to replace the use of separate connecting structures and/or soldering as a technique for use in establishing connections to flexible and other circuits. In these, applications, the requisite electrical contact may be established by mechanically pressing the terminal portions of the circuit against terminal pads on the connector, device or another circuit. Such pressure connections are customarily made with the aid of a resilient pressure applicator, such as an elastomeric member, which is placed in compression to bias at least one of the components to be electrically interconnected toward the other component to hold the terminal portions thereof in electrical contact.

An example of the aforementioned solderless connection system is disclosed in U.S. Pat. No. 4,468,074, hereby incorporated by reference. This patent discloses an apparatus wherein contact portions of a first array of conductive elements are urged against mating contacts of a second array of conductive elements by a pressure applicator comprising a resilient cellular plastic material thereby establishing and maintaining an electrical connection therebetween. The use of such a cellular resilient material permits a plurality of closely spaced exposed electrical conductors on or extending from a pair of substrates to be aligned and thereafter reliably pressed together, with the electrical connections being established by a requisite contact pressure applied to the substrates. Such a solderless connector may be employed to interconnect flexible circuits, to connect flexible circuits on rigid substrates, to establish connections between the leads extending from integrated circuits in a circuit pattern on a flexible or rigid circuit board, and in other applications.

Other solderless connectors are disclosed in U.S. Pat. Nos. 4,647,125, 4,655,524, 4,691,972, 4,717,345, 4,744,764, 4,538,885, 4,770,645, 4,832,609, all of which are cited in U.S. Pat. No. 4,913,656. Additional flexible circuit connectors using resilient materials are disclosed in U.S. Pat. Nos. 4,768,971, 4,695,258, 3,977,756. Other flexible circuit connectors are disclosed in U.S. Pat. Nos. 3,795,885, 4,871,315, 2,981,918, 4,808,112, and 4,116,516 and in the IBM Technical Disclosure Bulletin—Miller, Connector for Multilayer Circuit Package, Vol. 15, No. 5, October, 1972, pp. 1614-15 and Blackwell et al, Flexible Tape Cable Connection, Vol. 18, No. 11, April, 1976, p. 3830.

It will be appreciated that at least some of the aforementioned references disclose solderless connectors for connecting a flexible circuit and another flexible or rigid circuit device. However, there are many applications requiring at least two flexible circuits to be connected to a third flexible or rigid circuit device. A connector for such an application is disclosed in U.S. Pat. No. 4,913,656, hereby incorporated by reference. The connector disclosed uses a non-wiping, pressure-mated connection in a package with allowance for very tight tolerances on pad width and spacing, yet allowing for easy assembly and disassembly. Two flexible circuits are mounted to a clamp plate subassembly with the other circuit device located on a separate clamp backer plate. The sub-assembly includes a top clamp plate and a central circuit block having a longitudinal slot therethrough. The flexible circuits are sandwiched between the top clamp plate and the circuit block. One flexible circuit extends through the slot and is folded about the circuit block, trapping a resilient pressure pad between the end of the flexible circuit and the circuit block, to expose contact pads at the end of the flexible circuit. The other flexible circuit does not extend through the slot, but instead wraps about a longitudinal edge of the circuit block to similarly trap a resilient pressure pad and expose contact pads. The sub-assembly thus locates the flexible circuits in the appropriate area and provides an elastomeric pressure member in the contact area. The sub-assembly also provides strain relief for the flexible circuits to protect the contact area both before and after connection. The assembled connector is held in the assembled position with two screws tightened to where the hardware parts engage "stops" protecting the clamp from bowing, but allowing high enough torque on the fasteners to resist subsequent vibration. Although the connector disclosed in U.S. Pat. No. 4,913,656 does mate two or more flexible circuits to a third circuit device, it nevertheless has certain previously unrecognized drawbacks. One problem is the use of a single piece circuit block with a longitudinal slot therein. Such a circuit block requires that one of the flexible circuits be inserted through the slot during assembly (and folded, as described previously), resulting in significant scrap/rework costs when a flexible circuit is damaged during the insert and fold operations. In addition, pins extending from the circuit block are used to align and maintain the folded and wrapped flexible circuits on the circuit block. The flexible circuits of preformed radius must be stretched out of shape and wrapped over the pins, for alignment resulting in further scrap/rework.

Another problem with the aforementioned connector is related to the sub-assembly. Because the sub-assembly includes a top clamp plate and a circuit block sandwiching the flexible circuits, strain relief must be provided to allow for handling of the sub-assembly without damage thereto. Yet another problem is the location of the resilient pressure pads between the circuit block and the flexible circuits. The resilient pressure pads are used to apply constant pressure across the entire span of closely spaced electrical contacts to ensure that each pair of such contacts properly mate. The resilient pressure pads should thus be located on the side of the electrically mated contacts which is most compliant. Where the third circuit device is itself a flexible circuit, particularly one being more compliant than the first two flexible circuits, the resilient pressure pads are not optimally located on the side of the third flexible circuit.

SUMMARY OF THE INVENTION

In view of the foregoing, it is the principal object of this invention to improve electrical connectors.

Another object of this invention is to improve solderless, electrical compression connectors for establishing electrical contact between a pair of flexible circuits and another circuit device.

Still another object of this invention is an electrical connector which reduces the amount of scrap/rework generated during assembly.

Still another object of this invention is an electrical connector which simplifies the strain relief in subassemblies.

Still another object of this invention is an electrical connector in which the resilient pressure pads are optimally located.

These and other objects of this invention are accomplished by an electrical connector including a top clamp plate, two circuit bars, a resilient pressure pad, a bottom clamp plate, and means for fastening two flexible circuits and a third circuit device in mating electrical contact therein. The use of two circuit bars eliminates the need to insert a flexible circuit through a slot during manufacture and allows for replacement of a single flexible circuit. Each flexible circuit is mounted on and wrapped about a separate one of the circuit bars with an adhesive to create two solidly backed sub-assemblies without need for strain relief. The top clamp plate is then fastened to the subassemblies with screws and retaining clips to create a single sub-assembly. The resilient pressure pad is mounted on the bottom clamp plate and the third circuit device is mounted thereon, thereby providing optimal location of the pad when the third circuit device is more compliant than the flexible circuits. Each circuit bar is then mounted over the third circuit device to make electrical contact between the third circuit device and each flexible circuit. The components are aligned using pins extending upward from the bottom clamp plate to eliminate stretching of the flexible circuits during manufacture. The single sub-assembly is then fastened to the bottom clamp plate using screws to complete the assembly.

In an alternative embodiment, a resilient connector pressure pad having wires extending through and protruding from the thickness thereof is used. The resilient connector pressure pad is located between the flexible circuits and the third circuit device, the wires protruding therefrom actually completing the electrical contact. The wires improve the reliability of the connector by increasing its overall compliance and by piercing through any insulation, oxide, or contaminant on the surface of the third circuit device or flexible circuits. Also the additional compliance provided by the resilient connector pressure pad may allow the resilient pressure pad to be reduced in thickness or eliminated altogether.

The foregoing and other objects, features, and advantages of the invention will be apparent to one of skill in the art from the following more particular description of the preferred embodiments of the invention, as illustrated in the accompanying drawing.

DESCRIPTION OF THE PREFERRED EMBODIMENT

Figure 1:
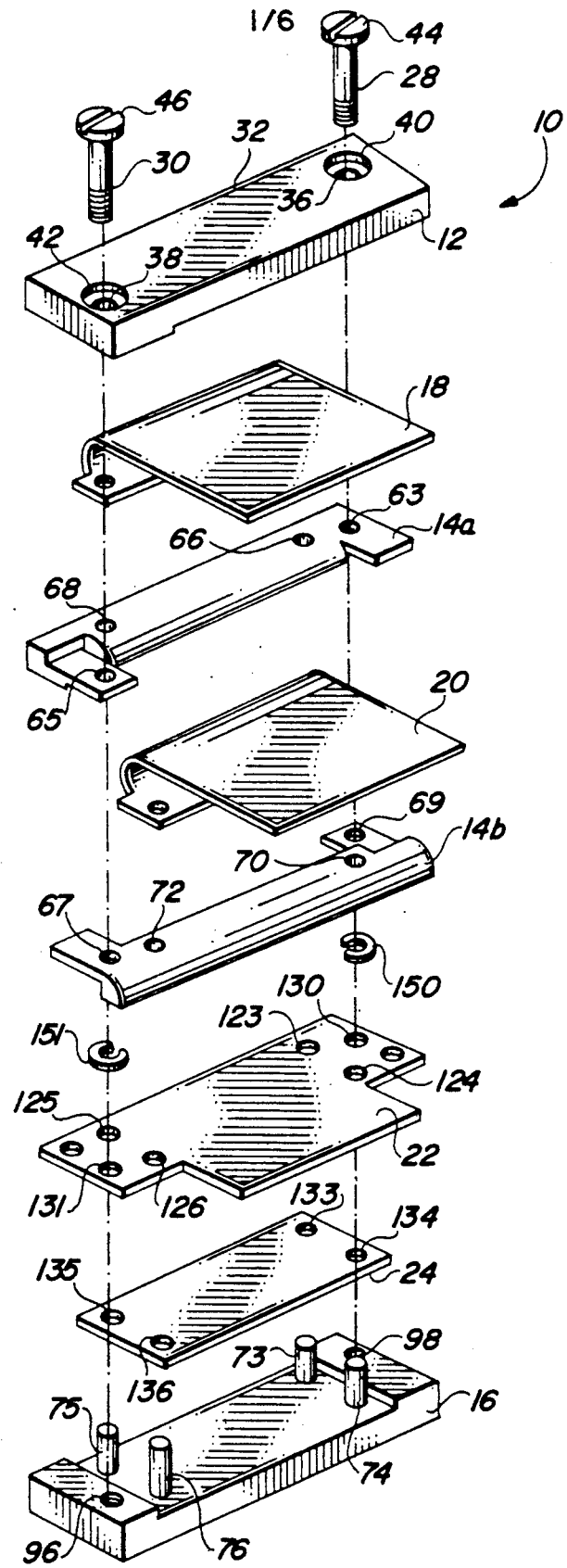
FIG. 1 is a an exploded perspective view of the solderless connector in accordance with the invention.

Referring now more particularly to the drawing, like numerals denote like features and structural elements in the various figures.

Figure 2:
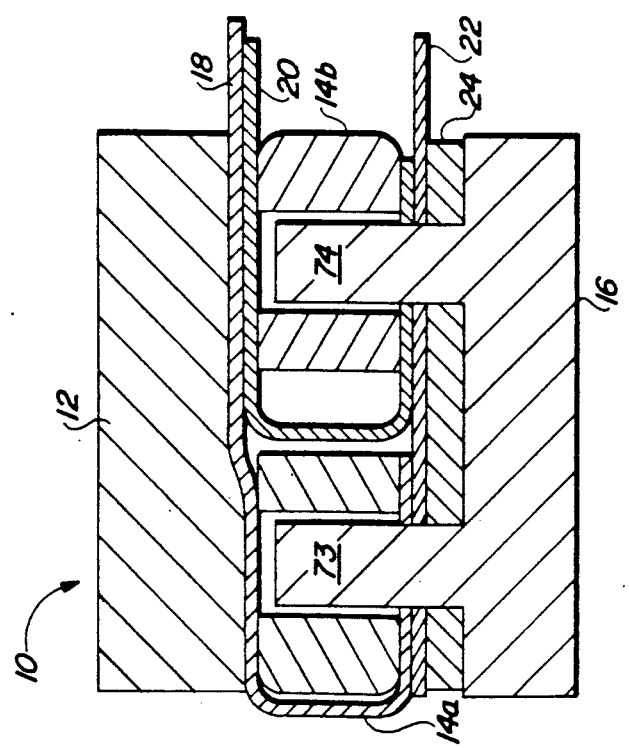
FIG. 2 is a cross-sectional elevation view through the connector of FIG. 1 subsequent to assembly.

Referring to FIGS. 1 and 2, a solderless connector in accordance with the present invention is shown generally at 10. Connector 10 comprises three primary parts, all of which are preferably molded or cast. These parts include a top clamp plate 12 (hereinafter referred to simply as top plate, which is shown in more detail in FIGS. 3-5), a pair of centrally located circuit bars 14a and 14b (which is shown in more detail in FIGS. 6-8) and a bottom clamp plate 16 (hereinafter referred to as bottom plate, which is shown in more detail in FIGS. 9-11). These three components can be molded from a suitable material such as an engineering thermoset, or any rigid material that is dimensionally stable and has a high flex modulus. Examples of such suitable materials are a molding material sold under the tradename RX640 by Rogers Corporation, polyphenylene sulfide (PPS), liquid crystal polymer, aluminum, or zinc. Molded components 12, 14a, 14b, and 16 cooperate to effect electrical and mechanical communication between a pair of flexible circuit cables 18 and 20 (hereinafter referred to simply as flexible circuits) and a third circuit device 22 (hereinafter referred to simply as circuit device) which is also flexible. Flexible circuit 18 is mounted to circuit bar 14a with an adhesive, and flexible circuit 20 is mounted to circuit bar 14b with an adhesive, to each form a sub-assembly. An example of a suitable adhesive is any acrylic adhesive.

The two flexible circuit sub-assemblies are then joined to top plate 12 with screws 28 and 30 and retaining clips 150 and 151, thereby forming a single sub-assembly. It will be appreciated that circuit bars 14a and 14b, and top plate 12 act to sandwich therebetween both flexible circuits 18 and 20. Flexible circuit 18 is sandwiched between circuit bar 14a and top plate 12, and flexible circuits 18 and 20 are sandwiched between circuit bar 14b and top plate 12. Elastomeric or resilient pressure pad 24 (hereinafter referred to simply as resilient pad), circuit device 22, and flexible circuits 18 and 20 are sandwiched between circuit bars 14a and 14b and the bottom plate 16. Resilient pad 24, circuit device 22, and flexible circuit 18 are sandwiched between circuit bar 14a and bottom plate 16. Resilient pad 24, circuit device 22, and flexible circuit 20 are sandwiched between circuit bar 14b and bottom plate 16. Resilient pad 24 may be vulcanized onto bottom plate 16, or may be separate therefrom, but for purposes of the invention is always considered to be "between" the circuit bar and the bottom plate. A suitable material for resilient pad 24 is R/Flex 8770, obtainable from Rogers Corporation, Rogers, Conn and further disclosed in U.S. Pat. No. 4,468,074, and LCS 740 and 745 silicone rubbers obtainable from Dow Corning Corporation.

Figure 3:
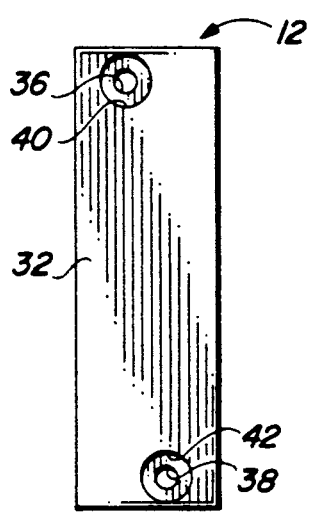
FIG. 3 is a top plan view of the top plate used in the connector of FIGS. 1-2.
Figure 4:
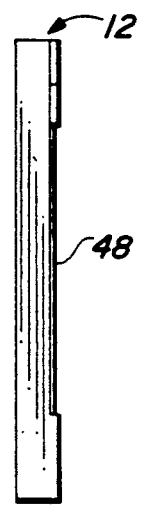
FIG. 4 is a side elevation view of the top plate of FIG. 3.
Figure 5:
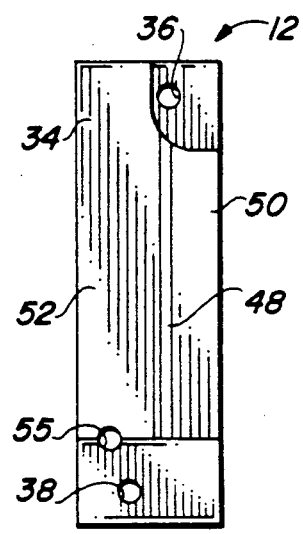
FIG. 5 is a bottom plan view of the top plate of FIG. 3.

Referring now to FIGS. 3-5, top plate 12 has a generally rectangular configuration and includes an upper surface 32 and a lower surface 34. Each longitudinal end of top plate 12 has an opening 36 and 38 therethrough. It will be appreciated that openings 36 and 38 are offset with respect to one another. A counterbore 40 and 42 is provided in upper surface 32 in alignment with each respective opening 36 and 38. Counterbores 40 and 42 receive flat heads 44 and 46 of screw fasteners 28 and 30 so that flat heads 44 and 46 will be flush with upper surface 32 of top plate 12 subsequent to assembly. Lower surface 34 of top plate 12 includes a shoulder 48 along the length thereof which defines a raised portion 50 and a depressed portion 52 of lower surface 34. Also included in lower surface 34 of top plate 12 is recess or opening 55 which, unlike openings 36 and 38, does not necessarily extend completely through the thickness of top plate 12. A recess 55 is shown in FIGS. 1-5 - i.e. it does not extend completely through such thickness.

Figure 6:
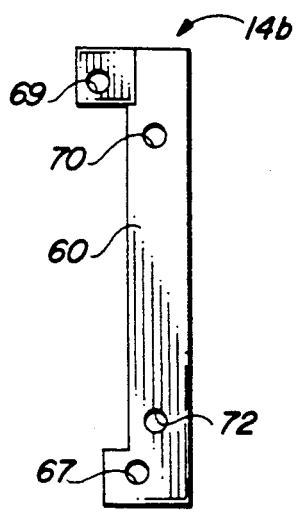
FIG. 6 is a top plan view of a circuit bar used in the connector of FIGS. 1-2.
Figure 7:
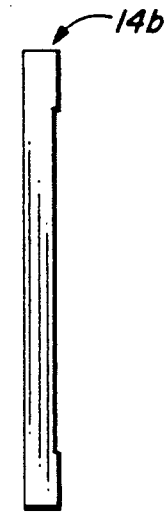
FIG. 7 is a side elevation view of the circuit bar of FIG. 6.
Figure 8:
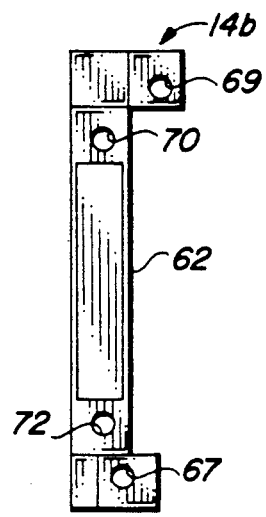
FIG. 8 is a bottom plan view of the circuit bar of FIG. 6.

Referring to FIGS. 6-8, circuit bar 14b will now be described. Circuit bar 14a is not herein described but is substantially identical, except that it is transposed as used. Circuit bar 14b is substantially rectangular and includes an upper surface 60 and a lower surface 62. Lower surface 62 includes a depressed and a raised portion to compensate for thickness variations in the flexible circuit such that the flexible circuit lies parallel with the remainder of lower surface 62 when the flexible circuit is wrapped around a longitudinal edge of the circuit bar. An opening 67 is sized to align and mate with opening 38 from top plate 12 and opening 65 in circuit bar 14a. Opening 69 is similarly aligned to openings 36 and 63. A pair of openings 70 and 72 are sized to align and mate with a pair of respective pins 74 and 76 which extend upwardly from bottom plate 16 as will be described hereinafter.

Figure 9:
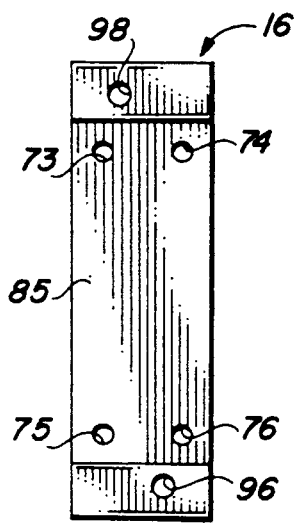
FIG. 9 is a top plan view of the bottom plate used in the connector of FIGS. 1-2.
Figure 10:
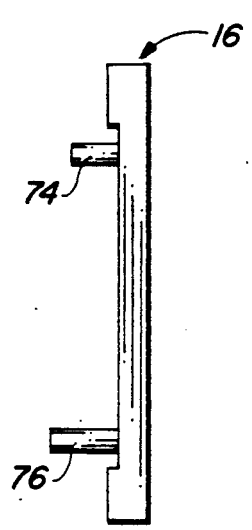
FIG. 10 is a side elevation view of the bottom plate of FIG. 9.
Figure 11:
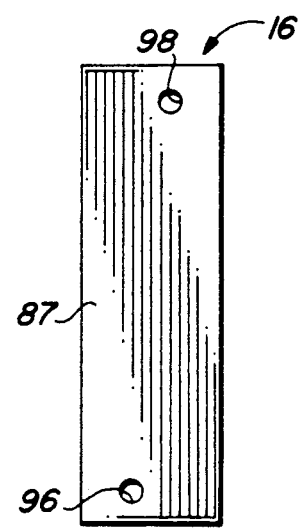
FIG. 11 is a bottom plan view of the bottom plate of FIG. 9.

Referring now to FIGS. 9-11, bottom plate 16 is substantially rectangular and includes a pair of threaded throughholes 96 and 98 which are positioned to align and mate with openings 63, 65, 67, and 69 and throughholes 38 and 36 respectively. Thus, when top plate 12, circuit bars 14a and 14b, and bottom plate 16 are aligned, threaded screw fasteners 28 and 30 are received in the aligned openings and are threadably mated. Throughholes 130 and 131 in circuit device 22 are also suitably aligned and mated to accommodate threaded screw fasteners 28 and 30. Bottom plate 16 includes an upper surface 85 and a lower surface 87. Bottom plate 16 also includes four alignment pins 73-76 which extend upward from upper surface 85. Throughholes 133-136 in resilient pad 24, throughholes 123-126 in circuit device 22, and throughholes 70 and 72 in circuit bar 14b and their counterpart holes 66 and 68 in circuit bar 14a are mated and aligned to accommodate the passage of alignment pins 73-76 therethrough. In addition, recess 55 is aligned to accommodate the end of alignment pin 76. Recess 55 thus ensures that top plate 32 can only be aligned and mated to the remainder of electrical connector 10 in one orientation, thereby simplifying manufacturing operations. In an alternative embodiment, recess 55 may be eliminated if alignment pin 76 is not elongated but is instead the same length as alignment pins 73-75.

Referring again to FIGS. 1 and 2, the sub-assemblies of flexible circuit 18 and circuit bar 14a, and flexible circuit 20 and circuit bar 14b will now be further described. Flexible circuits 18 and 20 are preformed so as to terminate in a loop, as shown in the drawing. Each flexible circuit includes a plurality of circuit traces which terminate and are exposed on the lower surface of the looped terminal portions thereof. The terminal portions of flexible circuits 18 and 20 are laterally expanded and have openings therethrough to align and mate with alignment pins 73-76. Because circuit bars 14a and 14b are separate parts, there is no need to insert one of the looped flexible circuits 18 and 20 through a longitudinal slot of any kind. Instead, circuit bar 14a is simply fitted within the looped region of flexible circuit 18 and circuit bar 14b is fitted within the looped region of flexible circuit 20 thereby simplifying assembly and reducing scrap/rework formerly resulting from the difficult step of inserting one of the flexible circuits through a longitudinal slot in a circuit block. In addition, scrap/rework is reduced because circuit bars 14a and 14b include no alignment pins extending therefrom, eliminating the need to stretch flexible circuits 18 and 20 thereover during assembly as was formerly done. When rework is required, a single defective flexible circuit can now be replaced. Also, because the flexible circuits are attached to the circuit bars with an adhesive thereby eliminating top plate 12 from the sub-assembly, there is no play in the flexible circuits of such sub-assemblies and strain relief means can be eliminated. Thus, top plate 12, circuit bars 14a and 14b, and flexible circuits 18 and 20 are individually easier to manufacture and assemble than their earlier counterparts.

After flexible circuits 18 and 20 have been mounted as discussed on circuit bars 14a and 14b respectively, top plate 12, threaded screw fasteners 28 and 30 (for simplicity, the threads are not shown in the drawing), and retaining clips 150 and 151 are assembled. Next, resilient pad 24, circuit device 22, and the sub-assembly are positioned on top of bottom plate 16. Threaded screw fasteners 28 and 30 are then extended through the aforementioned openings to releasably fasten electrical connector 10 into a single assembly. It will be appreciated that flexible circuit 18 has a slightly longer length than flexible circuit 20. Such longer length allows for the extra distance that flexible circuit 18 must travel in the final assembly.

Circuit device 22 includes a terminal portion having two sets of exposed circuit traces on the upper surface thereof. It will be appreciated that each set of circuit traces on circuit device 22 is constructed to align and mate with the corresponding circuit traces of either flexible circuit 18 or flexible circuit 20. The circuit traces of flexible circuits 18 and 20, and circuit device 22, are not shown in the drawing for convenience. For an example of such suitable circuit traces, see U.S. Pat. No. 4,913,656. Such circuit traces have a circuit pattern with 5 mil pads at 15 mil centers.

When electrical connector 10 is assembled by tightening threaded screw fasteners 28 and 30, resilient pad 24 is compressed and then provides the necessary clamping force to the contact pad areas. The fasteners are tightened to the torque required to resist vibration in the operating environment and in so doing, the ends of top plate 12, circuit bars 14a and 14b, and bottom plate 16 are brought together. In such manner, the clamping force on the contact pads is controlled within the desired range based on the tolerances involved. It will be appreciated that while two flexible circuits 18 and 20 have been shown connected to a third circuit device 22, the present invention contemplates that any number of flexible circuits may be used. For example, an additional circuit bar and flexible circuit could be added to electrical connector 10 with slight alterations to top plate 12, circuit device 22, resilient pad 24, bottom plate 16, and possibly circuit bar 14b (and, possibly, with additional threaded screw fasteners). Three or more flexible circuits could thus be used in conjunction with the present invention. The present invention may also be used in conjunction with multi-layer circuit devices. When affecting electrical connection between multi-layer circuit devices, a stair-step construction or single, plain termination construction may be used. For further description of such multi-layer circuit devices see U.S Pat. No. 4,913,656. In the preferred embodiment, circuit device 22 is a third flexible circuit which is more compliant than flexible circuits 18 and 20. Because such third flexible circuit would be located adjacent to resilient pad 24 in electrical connector 10, resilient pad 24 would be optimally located closest to the most compliant of the actual circuit components, thereby improving reliability of the electrical contact between the flexible circuits and the circuit device. In an alternative embodiment, two circuit devices may be used, one extending to one side of bottom plate 16 and mating with pins 73 and 75, and one extending to the other side of bottom plate 16 and mating with pins 74 and 76.

In still another alternative embodiment, the two or more flexible circuits may include an additional loop so as to protrude outwardly and loop about the top plate to expose additional circuit traces on the upper surface of the top plate. In this way, contact areas could be formed on the top of electrical connector 10 similar to those already disclosed so as to produce a nonwiping "stack" connector that could be sandwiched between two boards or flexible circuits.

The connector of the present invention thus provides a means of effecting a nonwiping pressure mated connection between at least a pair of flexible circuits and another circuit device in a compact package with allowance for very tight tolerances on pad and width spacing.

Figure 12:
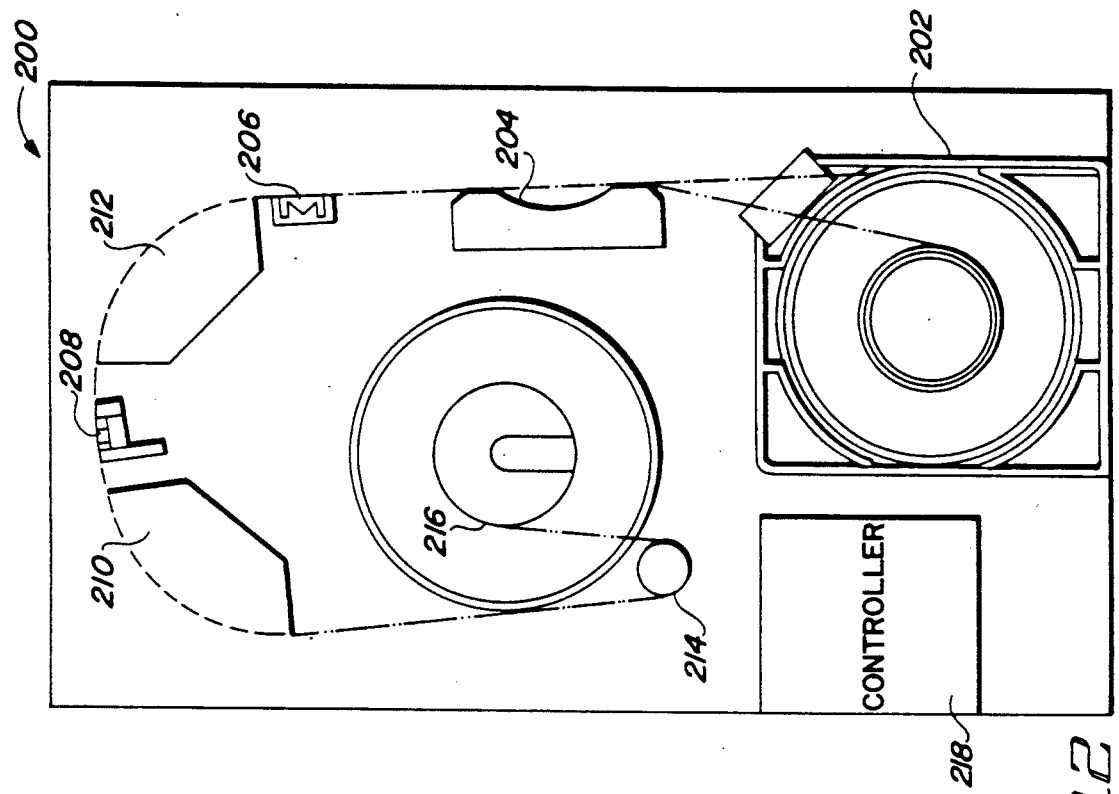
FIG. 12 is a schematic diagram of a magnetic tape drive according to the invention.

Referring to FIG. 12, a magnetic tape drive 200 according to the invention will now be described. Tape is provided by a removable tape cartridge 202, including a supply reel therein. At the opposite end of the tape path is storage reel 216. Along the tape path are a vibration decoupler 204, cleaner blade 206, magnetic tape head 208, air bearings 210 and 212 flanking either side of magnetic tape head 208, and tension transducer 214. Controller 218 resides over the transfer of data between a host processor and the tape, including both tape movement and read/write operations. The connections between controller 218 and the various other components of tape drive 200 are not shown in the drawing. An example of a tape drive according to FIG. 12 is the IBM 3490 Tape Drive.

Figure 13:
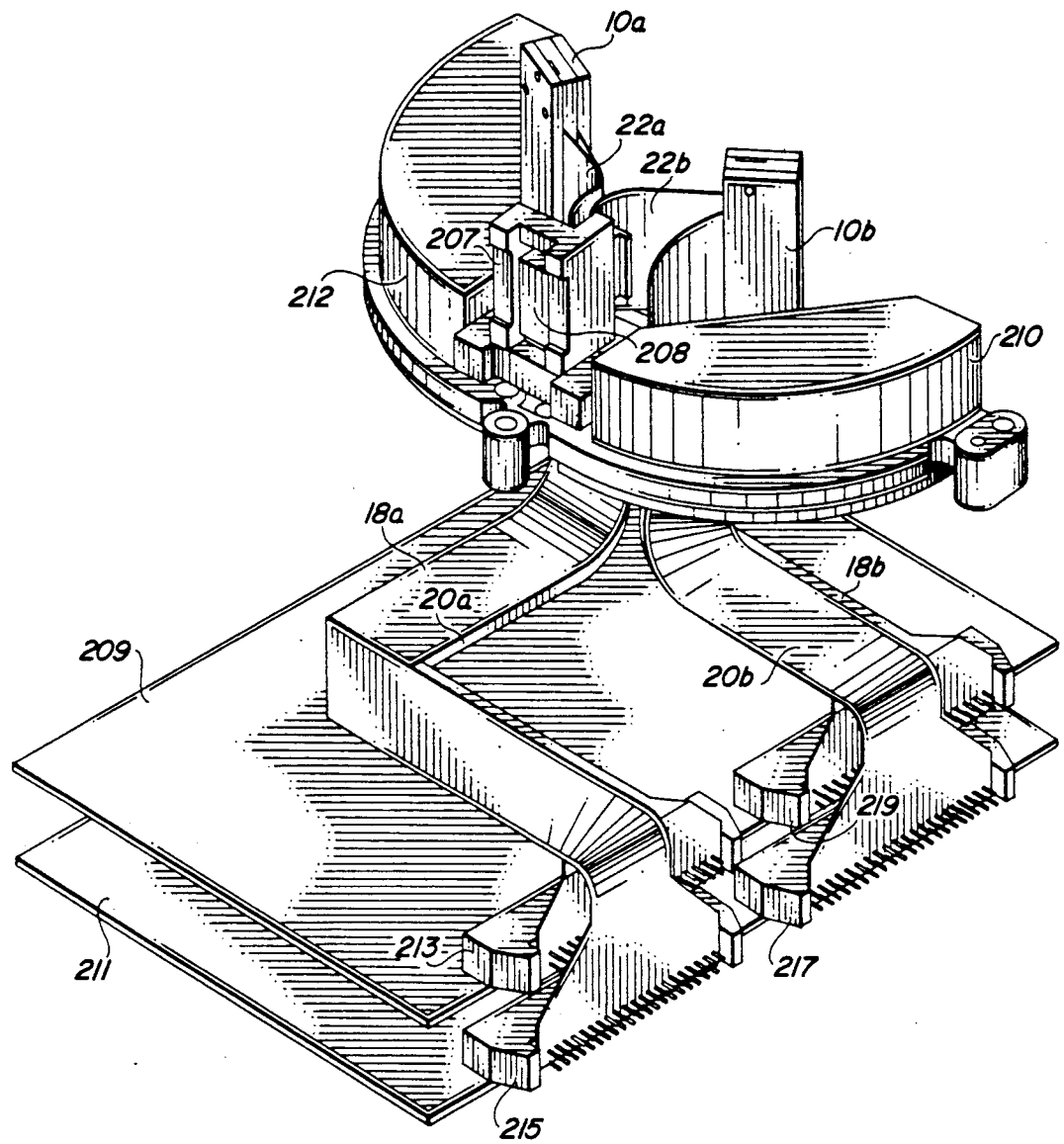
FIG. 13 is a perspective view of a magnetic tape head field replaceable unit according to the invention.

Referring to FIG. 13, a magnetic tape head field replaceable unit (FRU) for a tape drive will now be described. Multitrack magnetic tape head 208 is mounted in head frame 207 between air bearings 210 and 212. Two electrical connectors 10a and 10b connect head 208 to the write card 209 and read card 211 of controller 218. Electrical connector 10a connects flexible circuit 22a (from magnetic tape head 208) to flexible circuits 18a and 20a. Electrical connector 10b connects flexible circuit 22b (from magnetic tape head 208) to flexible circuits 18b and 20b. Flexible circuits 18a, 18b, 20a, and 20b are connected to write card 209 and read card 211 by solder pin connectors 213, 215, 217, and 219.

Figure 14:
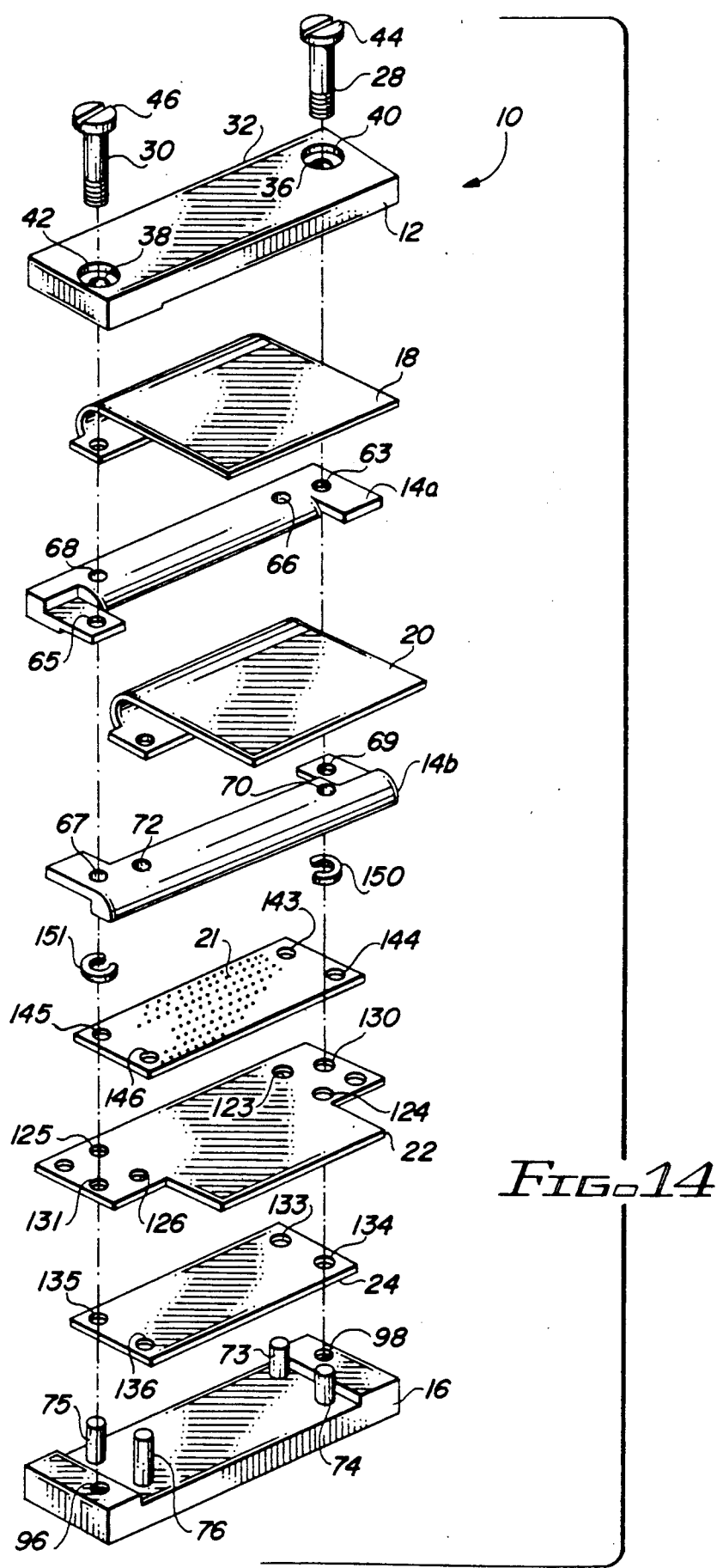
FIG. 14 is an exploded perspective view of an another solderless connector in accordance with the invention.
Figure 15:
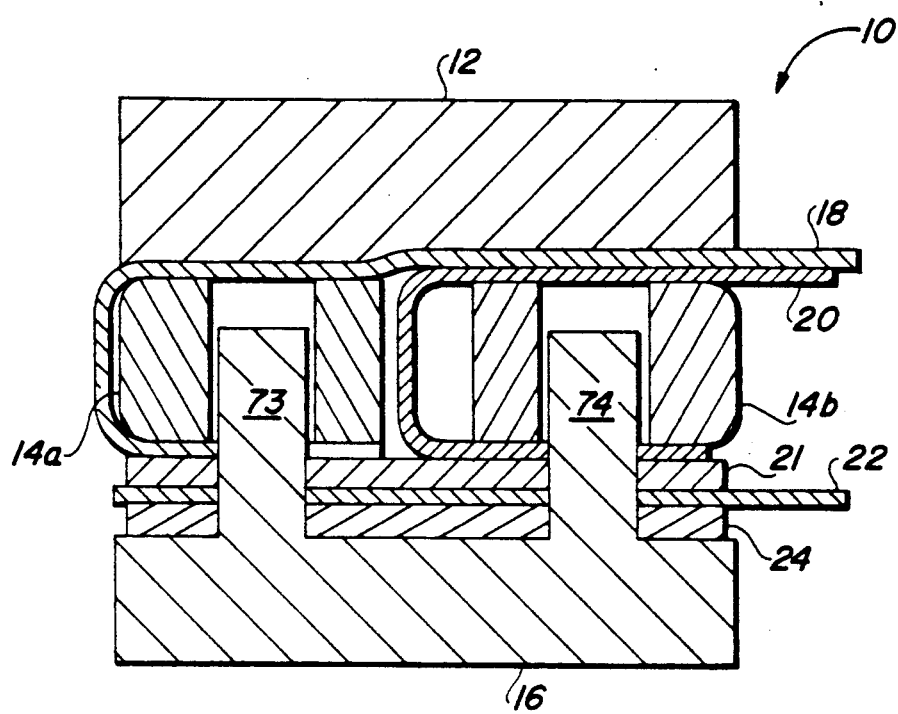
FIG. 15 is a cross-sectional elevation view through the connector of FIG. 14 subsequent to assembly.

Referring to FIGS. 14–15, an alternative embodiment of the present invention will now be described. The alternative electrical connector is the same as that shown in FIGS. 1–11 except for the addition of resilient connector pad 21 interposed between the flexible circuit sub-assembly and circuit device 22. Resilient connector pad 21 includes throughholes 143–146 and differs from resilient pad 24 in that it contains wires embedded therein and protruding therethrough the thickness thereof. The wires protrude from both the upper surface and lower surface of resilient connector pad 21 and are represented in FIG. 14 as dots on the upper surface of the resilient connector pad. The wires make the actual electrical contact between flexible circuits 18 and 20 and circuit device 22. The wires protruding from resilient connector pad 21 improve the reliability of electrical connector 10 in two ways. First, the wires pierce any oxide or contaminant on the surfaces of the electrical contact pads of flexible circuits 18 and 20 and circuit device 22. The additional resiliency provided by pad 21 improves the overall compliance of electrical connector 10. The additional resiliency provided is located between the two sets of electrical contacts being mated, and is thus most optimally located. With the addition of resilient connector pad 21, resilient pad 24 can be reduced in thickness or, possibly, eliminated altogether.

Figure 16:
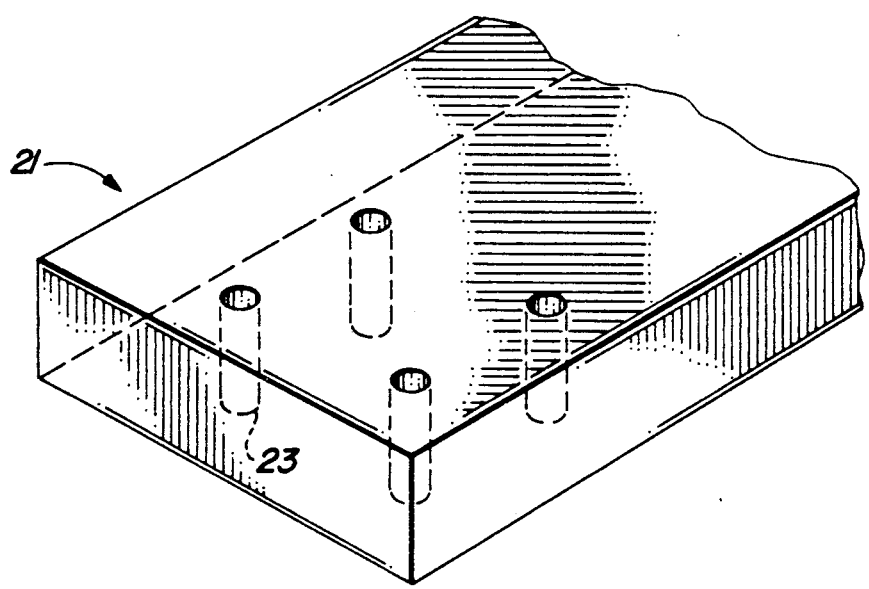
FIG. 16 is an enlarged view of the resilient connector pad of FIGS. 14-15.

Referring to FIG. 16, resilient connector pad 21 is shown. The wires 23 embedded in resilient connector pad 21 are shown individually, but may be embedded in bunches. An example of resilient connector pad 21 is the connector W series available from Fujipoly Corporation of Cranford, N.J. Wires 23 are gold plated and embedded at 300–2000 wires per square centimeter in silicone rubber.

While the invention has been shown and described with respect to a preferred embodiment thereof, it will be understood by those skilled in the art that various changes in detail may be made therein without departing from the spirit, scope, and teaching of the invention. For example, openings may exist in flexible circuits 18 and 20 and circuit device 22 in addition to those shown in the drawing. Such holes might exist to make these components compatible with other electrical connectors as well, such as that disclosed in U.S. Pat. No. 4,913,656. The electrical connector of the aforementioned patent requires additional holes to accommodate the passage of pins or screws therethrough. Such holes may be included in the electrical connector of the present invention, so long as they are not located so as to be detrimental to the operation of the electrical connector. Finally, electrical connector 10 can be employed in any magnetic tape drive. Accordingly, the invention disclosed herein is to be limited only as specified in the following claims.

What is claimed is:

1. An electrical connector for connecting two flexible circuits to a circuit device comprising:
   a top plate;
   a first and a second circuit bar;
   a first and a second flexible circuit, the first flexible circuit sandwiched between the top plate and the first circuit bar and wrapped about a longitudinal edge of the first circuit bar, the second flexible circuit sandwiched between the top plate and second circuit bar and wrapped about a longitudinal edge of the second circuit bar;
   a circuit device electrically connected to the first and second flexible circuits;
   a resilient pad;
   a bottom plate, the resilient pad between the circuit device and the bottom plate; and
   means for releasably fastening the top plate to the bottom plate.

2. The electrical connector of claim 1 wherein a longitudinal edge of the first circuit bar is substantially parallel to a longitudinal edge of the second circuit bar.

3. The electrical connector of claim 1 wherein the circuit device is more compliant than the first and second flexible circuits.

4. The electrical connector of claim 1 wherein the first flexible circuit is sandwiched between a longitudinal raised portion of a lower surface of the top plate and an upper surface of the first circuit bar and the first and second flexible circuits are sandwiched between a longitudinal depressed portion of a lower surface of the top plate and an upper surface of the second circuit bar.

5. The electrical connector of claim 1 wherein the first flexible circuit is attached to the first circuit bar with an adhesive to create a first sub-assembly and the second flexible circuit is attached to the second circuit bar with an adhesive to create a second sub-assembly.

6. The electrical connector of claim 1 wherein the resilient pad is between the circuit device and the upper surface of the bottom plate.

7. The electrical connector of claim 1 wherein the first flexible circuit and the circuit device are between a lower surface of the first circuit bar and the resilient pad and the second flexible circuit and the circuit device are between a lower surface of the second circuit bar and the resilient pad.

8. The electrical connector of claim 1 wherein the means for releasably fastening is a plurality of threaded fasteners each extending through an opening in the top plate, an opening in each circuit bar, an opening in the circuit device, and threaded into an opening in the bottom plate.

9. The electrical connector of claim 1 wherein the bottom plate has alignment pins each projecting upward from an upper surface thereof and through an opening in the resilient pad, an opening in the circuit device, and an opening in a circuit bar.

10. The electrical connector of claim 9 wherein one of the alignment pins projects upward into a recess in the top plate.

11. The electrical connector of claim 1 further comprising a resilient connector pad having wires extending through and protruding from the thickness thereof, the resilient connector pad between the first flexible circuit and the circuit device and between the second flexible circuit and the circuit device, the wires in the resilient connector pad electrically connecting the first and second flexible circuits to the circuit device.

12. The electrical connector of claim 11 wherein the resilient pad is eliminated, the circuit device instead between the resilient connector pad and the bottom plate.

13. An electrical connector for connecting two flexible circuits to a circuit device comprising:
    a top plate having a lower surface with a longitudinal raised portion and a longitudinal depressed portion separated by a shoulder;
    a first and a second circuit bar each having an upper and a lower surface, a longitudinal edge of the first circuit bar substantially parallel to a longitudinal edge of the second circuit bar;
    a first and a second flexible circuit, the first flexible circuit sandwiched between the longitudinal raised portion of the lower surface of the top plate and the upper surface of the first circuit bar and wrapped about a longitudinal edge of the first circuit bar, the second flexible circuit sandwiched between the longitudinal depressed portion of the lower surface of the top plate and the upper surface of the second circuit bar and wrapped about a longitudinal edge of the second circuit bar;
    a circuit device electrically connected to the first and second flexible circuits;
    a resilient pad;
    a bottom plate having an upper surface, the resilient pad between the circuit device and the upper surface of the bottom plate, the first flexible circuit and the circuit device between the lower surface of the first circuit bar and the resilient pad and the second flexible circuit and the circuit device between the lower surface of the second circuit bar and the resilient pad; and
    means for releasably fastening the top plate to the bottom plate.

14. The electrical connector of claim 13 wherein the circuit device is more compliant than the first and second flexible circuits.

15. The electrical connector of claim 13 wherein the first and second flexible circuits are sandwiched between the longitudinal depressed portion of the lower surface of the top plate and the upper surface of the second circuit bar.

16. The electrical connector of claim 13 wherein the first flexible circuit is attached to the first circuit bar with an adhesive to create a first sub-assembly and the second flexible circuit is attached to the second circuit bar with an adhesive to create a second sub-assembly.

17. The electrical connector of claim 13 wherein the means for releasably fastening is a plurality of threaded fasteners each extending through an opening in the top plate, an opening in each circuit bar, an opening in the circuit device, and threaded into an opening in the bottom plate.

18. The connector of claim 13 wherein the bottom plate has alignment pins each projecting upward from an upper surface thereof and through an opening in the resilient pad, an opening in the circuit device, and an opening in a circuit bar.

19. The electrical connector of claim 18 wherein one of the alignment pins projects upward into a recess in the top plate.

20. The electrical connector of claim 13 further comprising a resilient connector pad having wires extending through and protruding from the thickness thereof, the resilient connector pad between the first flexible circuit and the circuit device and between the second flexible circuit and the circuit device, the wires in the resilient connector pad electrically connecting the first and second flexible circuits to the circuit device.

21. The electrical connector of claim 20 wherein the resilient pad is eliminated, the circuit device instead between the resilient connector pad and the bottom plate.

22. An electrical connector for connecting two flexible circuits to a circuit device comprising:
  a top plate having a lower surface with a longitudinal raised portion and a longitudinal depressed portion separated by a shoulder, the top plate having openings therein;
  a first and a second circuit bar each having an upper and a lower surface and each having openings therein, a longitudinal edge of the first circuit bar substantially parallel to a longitudinal edge of the second circuit bar;
  a first and a second flexible circuit each having openings therein, the first flexible circuit attached to the first circuit bar with an adhesive to create a first subassembly and the second flexible circuit attached to the second circuit bar with an adhesive to create a second sub-assembly, the first flexible circuit sandwiched between the longitudinal raised portion of the lower surface of the top plate and the upper surface of the first circuit bar and wrapped about a longitudinal edge of the first circuit bar, the first and second flexible circuits sandwiched between the longitudinal depressed portion of the lower surface of the top plate and the upper surface of the second circuit bar, the second flexible circuit wrapped about a longitudinal edge of the second circuit bar;
  a circuit device which is more compliant than the first and second flexible circuits and having openings therein, the circuit device electrically connected to the first and second flexible circuits;
  a resilient pad having openings therein;
  a bottom plate having an upper surface and having threaded openings therein, the resilient pad between the circuit device and the upper surface of the bottom plate, the first flexible circuit and the circuit device between the lower surface of the first circuit bar and the resilient pad and the second flexible circuit and the circuit device between the lower surface of the second circuit bar and the resilient pad, the bottom plate having alignment pins each projecting upward from the upper surface thereof and through an opening in the resilient pad, an opening in the circuit device, and an opening in a circuit bar; and
  a plurality of threaded fasteners releasably fastening the top plate to the bottom plate, each fastener extending through an opening in the top plate, an opening in each circuit bar, an opening in the circuit device, and threaded into an opening in the bottom plate.

23. The electrical connector of claim 22 further comprising a resilient connector pad having wires extending through and protruding from the thickness thereof, the resilient connector pad between the first flexible circuit and the circuit device and between the second flexible circuit and the circuit device, the wires in the resilient connector pad electrically connecting the first and second flexible circuits to the circuit device.

24. The electrical connector of claim 23 wherein the resilient pad is eliminated, the circuit device instead between the resilient connector pad and the bottom plate.

25. A multitrack magnetic tape head assembly for writing to and reading from a magnetic tape comprising:
  a multitrack magnetic head including a plurality of write magnetic circuits, one write magnetic circuit for each track of the magnetic media, and a plurality of read magnetic circuits, one read magnetic circuit for each track of the magnetic media;
  a first bearing for supporting the magnetic tape on a first side of the magnetic head and a second bearing for supporting the magnetic tape on a second side of the magnetic head;
  a first and a second circuit card;
  a first pair of flexible circuits, a first end of one flexible circuit in the first pair connected to the first circuit card and a first end of the other flexible circuit in the first pair connected to the second circuit card;
  a second pair of flexible circuits, a first end of one flexible circuit in the second pair connected to the first circuit card and a first end of the other flexible circuit in the second pair connected to the second circuit card;
  a first and a second circuit device connected to the magnetic head; and
  a first electrical connector for electrically connecting the first pair of flexible circuits to the first circuit device and a second electrical connector for electrically connecting the second pair of flexible circuits to the second circuit device, the first and second electrical connectors each comprising:
  a top plate;
  a first and a second circuit bar, the first flexible circuit in the pair sandwiched between the top plate and the first circuit bar and wrapped about a longitudinal edge of the first circuit bar, the second flexible circuit in the pair sandwiched between the top plate and second circuit bar and wrapped about a longitudinal edge of the second circuit bar, the circuit device electrically connected to the second end of the first flexible circuit and to the second end of the second flexible circuit;

a resilient pad;

a bottom plate, the resilient pad between the circuit device and the bottom plate; and means for releasably fastening the top plate to the bottom plate.

26. The magnetic head assembly of claim 25 further comprising a resilient connector pad having wires extending through and protruding from the thickness thereof, the resilient connector pad between the first flexible circuit and the circuit device and between the second flexible circuit and the circuit device, the wires in the resilient connector pad electrically connecting the first and second flexible circuits to the circuit device.

27. The magnetic head assembly of claim 26 wherein the resilient pad is eliminated, the circuit device instead between the resilient connector pad and the bottom plate.

28. A magnetic tape drive comprising:

a tape supply reel;

a tape storage reel;

a multitrack magnetic head including a plurality of write magnetic circuits, one write magnetic circuit for each track of the magnetic media, and a plurality of read magnetic circuits, one read magnetic circuit for each track of the magnetic media;

a first bearing for supporting the magnetic tape on a first side of the magnetic head and a second bearing for supporting the magnetic tape on a second side of the magnetic head;

a controller including a first and a second circuit card;

a first pair of flexible circuits, a first end of one flexible circuit in the first pair connected to the first circuit card and a first end of the other flexible circuit in the first pair connected to the second circuit card;

a second pair of flexible circuits, a first end of one flexible circuit in the second pair connected to the first circuit card and a first end of the other flexible circuit in the second pair connected to the second circuit card;

a first and a second circuit device connected to the magnetic head; and a first electrical connector for electrically connecting the first pair of flexible circuits to the first circuit device and a second electrical connector for electrically connecting the second pair of flexible circuits to the second circuit device, the first and second electrical connectors each comprising:

a top plate;

a first and a second circuit bar, the first flexible circuit in the pair sandwiched between the top plate and the first circuit bar and wrapped about a longitudinal edge of the first circuit bar, the second flexible circuit in the pair sandwiched between the top plate and second circuit bar and wrapped about a longitudinal edge of the second circuit bar, the circuit device electrically connected to the second end of the first flexible circuit and to the second end of the second flexible circuit;

a resilient pad;

a bottom plate, the resilient pad between the circuit device and the bottom plate; and means for releasably fastening the top plate to the bottom plate.

29. The tape drive of claim 28 further comprising a resilient connector pad having wires extending through and protruding from the thickness thereof, the resilient connector pad between the first flexible circuit and the circuit device and between the second flexible circuit and the circuit device, the wires in the resilient connector pad electrically connecting the first and second flexible circuits to the circuit device.

30. The tape drive of claim 29 wherein the resilient pad is eliminated, the circuit device instead between the resilient connector pad and the bottom plate.

* * * * *